United States Patent [19]

Clark et al.

[11] Patent Number: 5,103,846
[45] Date of Patent: Apr. 14, 1992

[54] APPARATUS FOR CLEANING MECHANICAL DEVICES USING TERPENE COMPOUNDS

[75] Inventors: Gerald F. Clark, Peterborough; Gary J. Attalla, Hooksett, both of N.H.

[73] Assignee: Vitronics Corporation, Newmarket, N.H.

[21] Appl. No.: 400,372

[22] Filed: Aug. 30, 1989

[51] Int. Cl.$^5$ ................................................. B08B 3/02
[52] U.S. Cl. ................................. 134/57 R; 134/68; 134/72; 134/108; 134/127; 134/199; 134/102; 169/11
[58] Field of Search .................... 134/102, 57 R, 58 R, 134/64 R, 68, 72, 122 R, 107, 105, 108, 127, 131, 133, 199, 102; 169/60, 61, 11

[56] References Cited

U.S. PATENT DOCUMENTS

| | | | |
|---|---|---|---|
| 2,191,296 | 2/1940 | Kleine et al. | 134/72 |
| 2,524,047 | 10/1950 | Frese et al. | 169/11 X |
| 2,651,065 | 9/1953 | O'Connor | 134/83 X |
| 2,798,012 | 7/1957 | Fouquet | 134/200 X |
| 2,926,674 | 3/1960 | Umbricht et al. | 134/72 |
| 3,144,872 | 8/1964 | Kearney | 134/108 |
| 3,658,072 | 4/1972 | Santucci | 134/133 X |
| 3,753,466 | 8/1973 | Uematsu | 169/11 X |
| 3,830,307 | 8/1974 | Bragg et al. | 169/11 X |
| 3,868,272 | 2/1975 | Tardoskegyi | 134/72 X |
| 4,615,744 | 10/1986 | Murtha | 134/108 |
| 4,640,719 | 2/1987 | Hayes et al. | |

OTHER PUBLICATIONS

Surface Mount '88—Royal Plaza Trade Center, Marlborough, Mass., Aug. 29-Sep. 1, 1988—Schedule.
Attalla, Gary, "Equipment Considerations When Cleaning with Terpene Compounds", Surface Mount '88 Conference, pp. 499-504.
GRAM EC-1850 product literature.
"Gram Corporation Announces the Newest Member", News Release, Jul. 15, 1988.
Letter dated May 25, 1988 to Circuits Manufacturing from Vitronics Corporation; and a News Release dated May 24, 1988.
Vitronics/GRAM 1821 Aqueous Cleaners product literature.
Letter dated May 27, 1988 to Gary Attalla of Vitronics Corporation from Craig Hood of Petroferm.
Attalla, Gary, "Evaluating Terpene/Surfactant Mixtures in In-Line Spray Equipment", NEPCON WEST—Feb. or Mar. 1989, pp. 532-535.
Hayes, Michael E., Ph.D., "High Performance Cleaning with Non-Halogenated Solvents", NEPCON WEST, Feb. or Mar. 1989, pp. 536-547.
Hayes, Michael E., Ph.D., "High Performance Cleaning with Terpene/Surfactant Mixtures", Surface Mount Conference, Aug. 1988.
Treiber Series 400 Aqueous Cleaners advertising brochure.
Letter dated Aug. 9, 1988 from Gary Attalla to AT&T Bell Laboratories and an attached quotation for an EC-1850 Cleaner bearing the same date.
Order dated Aug. 31, 1988 from AT&T Bell Laboratories for shipment of an EC-1850 Cleaner.

Primary Examiner—Frankie L. Stinson
Attorney, Agent, or Firm—Wolf, Greenfield & Sacks

[57] ABSTRACT

Apparatus for cleaning printed wiring boards and/or printed circuit boards after soldering thereof for removal of rosin soldering fluxes using terpene compounds. The apparatus includes three separate components, a first housing containing the terpene washing apparatus, a second housing containing a water rinsing apparatus, and intermediate conveying means for transporting the devices from the first housing to the second housing. This intermediate conveying means should be disposed at an angle such that the end facing the second housing is disposed lower than the first end. Exhaust fans are provided for the first housing to prevent escape of terpene odors or vapors therefrom, while similar exhaust fans in the second housing prevent the escape of water vapor. Scrubbers are provided in the exhaust ducts from the first housing to prevent terpene compounds from escaping to the atmosphere. A flame detector prevents the introduction of boards having flames thereon or being overheated. A series of temperature controls prevent the terpene vapor temperature from rising above a predetermined value to prevent the vapors from igniting.

16 Claims, 5 Drawing Sheets

APPARATUS FOR CLEANING MECHANICAL DEVICES USING TERPENE COMPOUNDS

FIELD OF THE INVENTION

This invention relates generally to cleaning apparatus for mechanical devices, and more particularly to apparatus for cleaning printed circuit boards utilizing terpene compounds.

BACKGROUND OF THE INVENTION

In the fabrication of printed wiring boards and/or printed circuit boards, soldering is the preferred technique for electrically connecting components. Soldering fluxes are first applied to the substrate board material to ensure firm, uniform bonding of the solder. While both rosin and non rosin soldering fluxes are available, rosin fluxes are preferred because they are less corrosive, and have a much longer history of use. The non rosin, water soluble fluxes are a more recent development. However, these non-rosin fluxes contain strong acids and/or amine hydrohalides and are thus corrosive, and can cause circuit failure if residual traces are not carefully removed. While batch type or underbrush cleaners were initially employed, in line solvent cleaners later were adopted to meet demands of increased throughput. The removal of rosin fluxes from printed circuit boards or printed wiring boards has traditionally been accomplished using chlorinated hydrocarbon and chlorofluorinated solvents such as 1, 1, 1, -trichlorethane, trichloromonofluoromethane, methylenechloride, trichlorotrifluoroethane, methylchloroform and CFC 113.

By the early 1970's aqueous cleaners using alkaline cleaning compounds such as the alkanol amines, usually in the form of monoethanolamine, were adopted for rosin flux removal as an alternative to the toxic chlorinated hydrocarbon and chlorofluorinated solvents. These acqueous cleaners chemically react with the rosin flux to form a rosin soap through the process of saponification. Other organic substances such as surfactants or alcohol derivatives may be added to these alkaline cleaning compounds to facilitate the removal of such rosin soap. Unfortunately, these compounds, like the water soluble soldering fluxes, have a tendency to cause corrosion on the surfaces and interfaces of printed wiring boards if they are not completely and rapidly removed during the fabrication process.

With the advent of surface mounted devices which are soldered onto printed circuit boards using wave soldering or infrared solder reflow techniques, chlorinated hydrocarbon and chlorofluorinated solvents were once again required to remove the rosin fluxes because of their low cost fast evaporation characteristics, and ability to clean under lightly spaced components. However, during the past few years, it has become evident that chlorinated hydrocarbon and chlorofluorinated solvents are highly undesirable, because they are toxic, and their use is subject to close scrutiny by the Occupational Safety and Health Administration, and stringent containment equipment must be used. Moreover, if released into the environment, these solvents are not readily biodegradable, and they are thus hazardous for long periods of time. In particular, it has been discovered that chlorofluorocarbons are instrumental in depleting the ozone layer in the earth's atmosphere. This awareness of the dangers of such solvents has driven a search for safe, effective alternatives.

Alternatives which have emerged from this search are terpene compounds which have become increasingly popular in electronic cleaning applications. The use of terpene compounds for cleaning mechanical devices has been known for many years. The United States Department of Agriculture sponsored work on limonene and other citrus-based terpene compounds as long ago as the 1930's. However, there was very little interest in industrial uses of terpene compounds after that period of time, because of the availability at very low cost of halogenated solvents and petroleum distillates. With the reawakening of interest in terpene cleaners, it has been recognized that they provide a viable alternative to CFC's and other halogenated solvents for cleaning rosin fluxes from printed circuit boards. The use of one such terpene compound, which is sold under the trademark BIOACT EC 7 by Petroferm, Inc., for cleaning rosin fluxes, is the subject of U.S. Pat. No. 4,640,719 issued on Feb. 3, 1987.

In some regards, such terpene compounds are ideal for the removal of solder fluxes. Their ability to clean even the most closely spaced SMT boards has been shown in tests, and such terpene compounds work well with all available flux types. Terpene compounds are also cost competitive with most CFC's. Most terpene compounds are low in mamalian toxicity, and many are recognized as safe for use as food additives. In addition, they are produced by nearly all living plants, and therefore terpene compounds are ubiquitous components of the atmosphere for both rural and urban areas. Plants, particularly coniferous forests, release hundreds of millions of tons of terpene compounds into the air each year. In the atmosphere, terpene compounds are photochemically reactive. Wood and citrus products are the principal commercial sources of terpene compounds. Some terpene compounds are used as extracted, but most of them are obtained from natural oil refining processes. As a result, terpene compounds are commercially available in huge volumes.

Terpene compounds are readily biodegradable, and both municipal and industrial waste treatment facilities are normally able to handle terpene biodegradation without difficulty. Naturally derived terpene products contain no carbon chlorine bonds, and it is the absence of such carbon-chlorine bonds which are hard for biological systems to metabolize which renders terpene compounds so readily biodegradable. Terpene compounds can work at low temperatures, such as room temperatures, so it is not necessary to heat terpene cleaning baths. Terpene compounds are not volatile and have boiling points far above those of halogenated solvents. Also, most terpene compounds have a very high relative dissolving ability, sometimes even greater than that of any halogenated solvent.

Despite the foregoing characteristics of terpene compounds, they have yet to emerge as a commercially acceptable substitute for chlorinated and chlorofluorinated solvents. One reason is that most commercially available terpene compounds have flash points in the range of between 100° F. and 200° F. which causes them to be classified as combustible substances. This shortcoming must be taken into account in the production of any commercial machinery utilizing them as solvents for cleaning printed circuit boards. Another problem is the odor associated with most terpene compounds. Limonene is the terpene hydrocarbon most often used in cleaning products available in the market today. This material is derived from citrus by-products, such as oranges. The resulting odor, when concentrated, is pungent. A third problem is that, unlike chlorinated and chlorofluorinated solvents and petroleum distillates, terpene compounds are not volatile, so they will not evaporate. Therefore, they must be removed by rinsing. However, if terpene compounds are mixed with small amounts of water, they can turn to a gel and become useless. Finally, these terpene compounds tend to be very aggressive, precluding the use of certain elastomer materials in terpene cleaning systems.

It is therefore an object of the present invention to provide apparatus for the rapid, in line cleaning of printed circuit boards using terpene compounds.

It is another object of the present invention to provide apparatus for cleaning printed circuit boards which uses terpene compounds and which is safe for use with materials having flash points within the range of 100° to 200° F.

It is a further object of the present invention to provide apparatus for cleaning printed circuit boards which uses terpene compounds and which minimizes odor emissions to the atmosphere, and to the surrounding environment.

It is yet another further object of the present invention to provide apparatus for cleaning printed circuit boards which uses terpene compounds and which also employs a water rinse.

It is yet another further object of the present invention to provide apparatus for cleaning printed circuit boards which uses terpene compounds and which is safe for use in industrial environments.

SUMMARY OF THE INVENTION

These and other objects are achieved by the present invention which relates to apparatus for cleaning soldering fluxes from printed wiring boards and/or printed circuit boards using terpene compounds. The apparatus of this invention comprises three separate and distinct components, terpene compound washing apparatus, unloading apparatus, and water rinsing apparatus. Each component includes a product conveyor which is physically separated from the conveyors of the other components. In the washing apparatus, nozzles are used to spray the boards with a solution which typically includes a terpene compound combined with one or more terpene emulsifying surfactants. The unloading apparatus carries the boards from the washing apparatus to the rinsing apparatus. In the rinsing apparatus the terpene solution is removed from the boards by water sprayed through nozzles as the board passes therethrough.

The problem of terpene removal without contamination of the terpene bath is overcome by physically separating the rinsing apparatus from the washing apparatus by a separate and distinct unloading apparatus in which the conveyor is disposed at an angle with respect to the horizontal such that the end of the unloading conveyor adjacent the rinsing apparatus is lower than the end adjacent the washing apparatus. In this manner, water which inadvertently is splashed onto the unloading apparatus conveyor will be conducted by gravity downwardly back toward the rinsing apparatus, and not to the washing apparatus. Furthermore, the conveyors used for each apparatus are separate and are not physically connected, so no water is carried by the conveyors from the rinsing apparatus to the washing apparatus. Also, flexible baffles are placed along the entrance to the rinsing apparatus, so that water in the rinsing apparatus will not splash onto the conveyor of the unloading apparatus. Finally, to minimize the escape of water vapor or water droplets from the rinsing apparatus during operation, an exhaust duct coupled to a strong exhaust fan is disposed within the rinsing apparatus adjacent the entrance thereof. Another such exhaust duct may be placed adjacent the exit to the rinsing apparatus for the same purpose.

The odor problem associated with terpene compounds is overcome by the provision of a similar set of exhaust ducts within the washing apparatus adjacent the entrance and exit thereto. An exhaust fan is coupled to both ducts, drawing air through the entrance and exit to the washing apparatus, and exhausting gases from the interior of the washing apparatus. Disposed within the exhaust ducts are scrubbers, each of which includes a water rinse system. In addition, a hood is placed over each of the entrance and exit to the washing apparatus, which, when coupled with the strong air flow created by the exhaust fan, minimizes the escape of fumes from the interior of the washing apparatus.

The use of stainless steel for all components of the apparatus overcomes the problem of the aggressive nature of the terpene compounds.

A number of safeguards have been provided in the present invention to accommodate the low flash point of terpene compounds. Typically, in the washing apparatus, the terpene compound is disposed in an open bath beneath the conveyor carrying the printed circuit boards which are to be cleaned. The exhaust ducts previously described provide continual ventilation above the bath, preventing the build up to dangerous levels of vapors. Cooling coils are disposed within the terpene bath, and a temperature sensor maintains the bath temperature within a desired range. This temperature sensor automatically shuts off the washing apparatus if the bath temperature exceeds a predetermined value. In an alternative embodiment, a redundant temperature sensor in the terpene bath provides a back-up, in case the first sensor fails. In addition, one or two other temperature sensors are disposed above the bath. These temperature sensors are pre-programmed to release carbon dioxide into the space above the bath, should the temperature exceed a predetermined value, to suppress any potential fire hazard.

Another concern is that because the washing apparatus often is disposed directly in line with the high temperature soldering apparatus, it has been suggested that boards leaving the soldering apparatus and entering the washing apparatus may be involved in flames. Obviously, it would be undesirable if such a board entered the washing apparatus. To prevent such a possibility, a flame detector is disposed at the entrance to the washing apparatus and to immediately shut down the washing apparatus should a flame be detected on an entering board.

Air flow and water flow detectors are disposed in both scrubbers, so that if sufficient exhaust flow is not present, or if sufficient water flow for washing the scrubbers is not present, the washing apparatus will be shut off.

In addition to the foregoing, an automatic loading apparatus can be provided prior to the washing apparatus, for automatically transferring printed circuit boards from a soldering operation directly to the entrance to the washing apparatus. Alternatively, the boards can be loaded by hand, if desired. In a preferred embodiment, an air knife is disposed at the end of the washing apparatus but prior to the unloading apparatus for removal of some, but not all of the terpene compound solution. A dryer is provided within the rinsing apparatus for removal of water from the boards.

In an alternative embodiment, windows with locks are provided along the top of the washing apparatus. Sensors are provided indicating whether the window is in locked position. The washing apparatus cannot be activated until all windows are locked.

The foregoing apparatus overcomes the problems associated with the use of terpene compounds for washing rosin soldering fluxes from printed wiring boards and/or printed circuit boards, and permits the washing of such boards on an assembly line basis in an in-line configuration with an existing soldering system.

BRIEF DESCRIPTION OF THE DRAWINGS

The objects, advantages and features of this invention will be more clearly appreciated from the following detailed description taken in conjunction with the accompanying drawings in which.

DETAILED DESCRIPTION OF THE PREFERRED EMBODIMENTS

Figure 1:
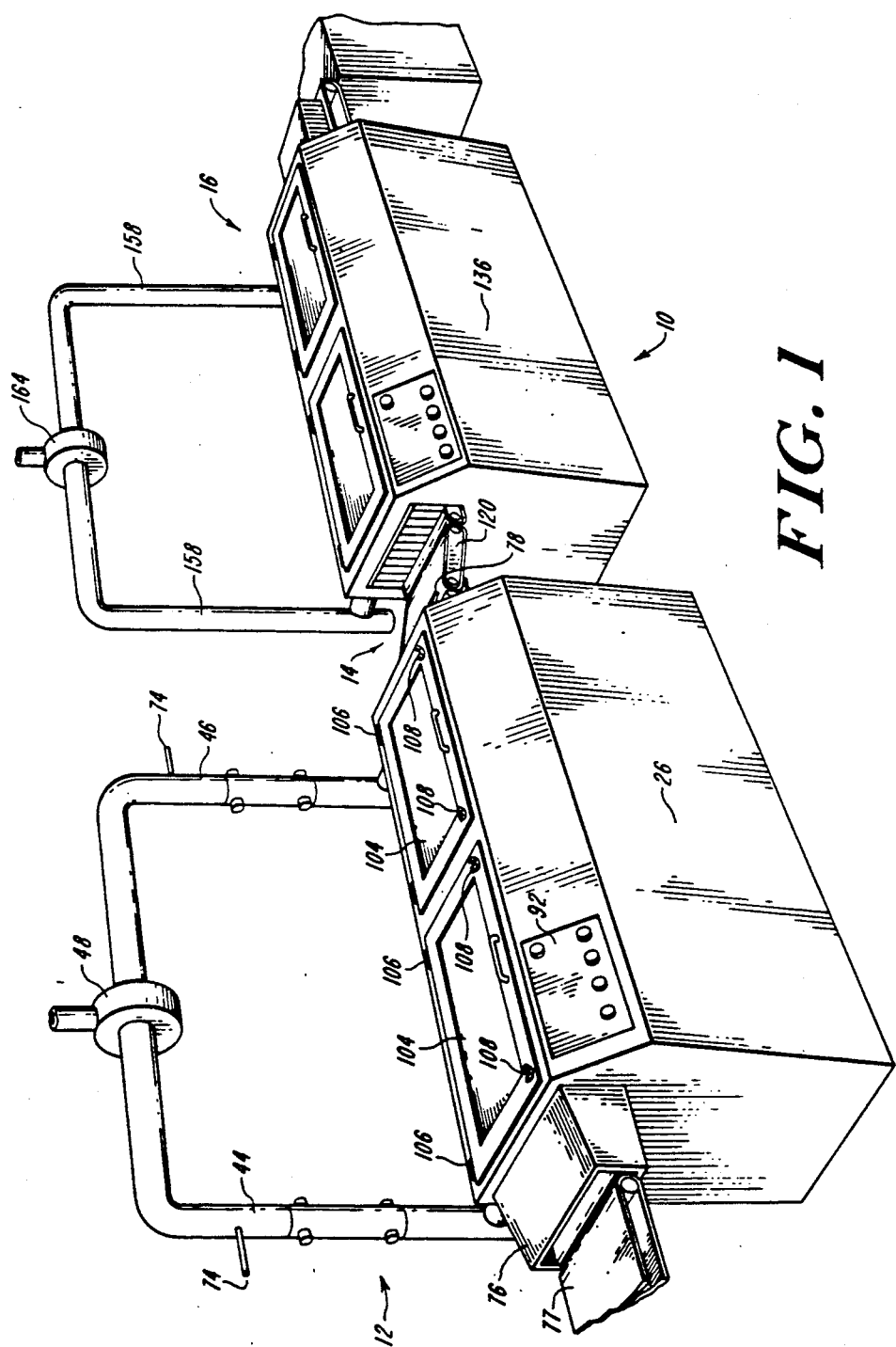
FIG. 1 is a perspective view of the apparatus of this invention.
Figure 2:
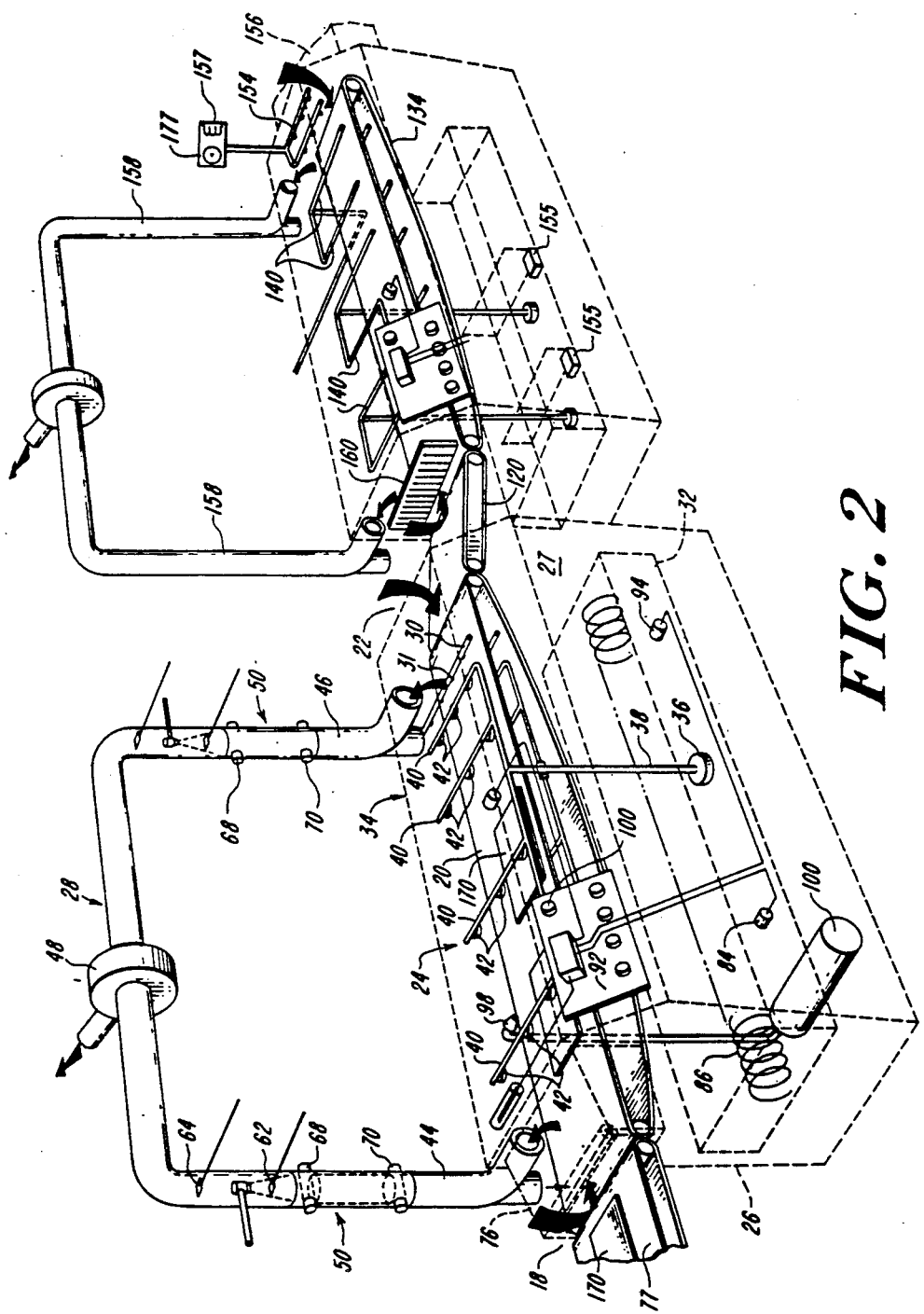
FIG. 2 is a perspective view of the interior of the apparatus of FIG. 1 of this invention.
Figure 3:
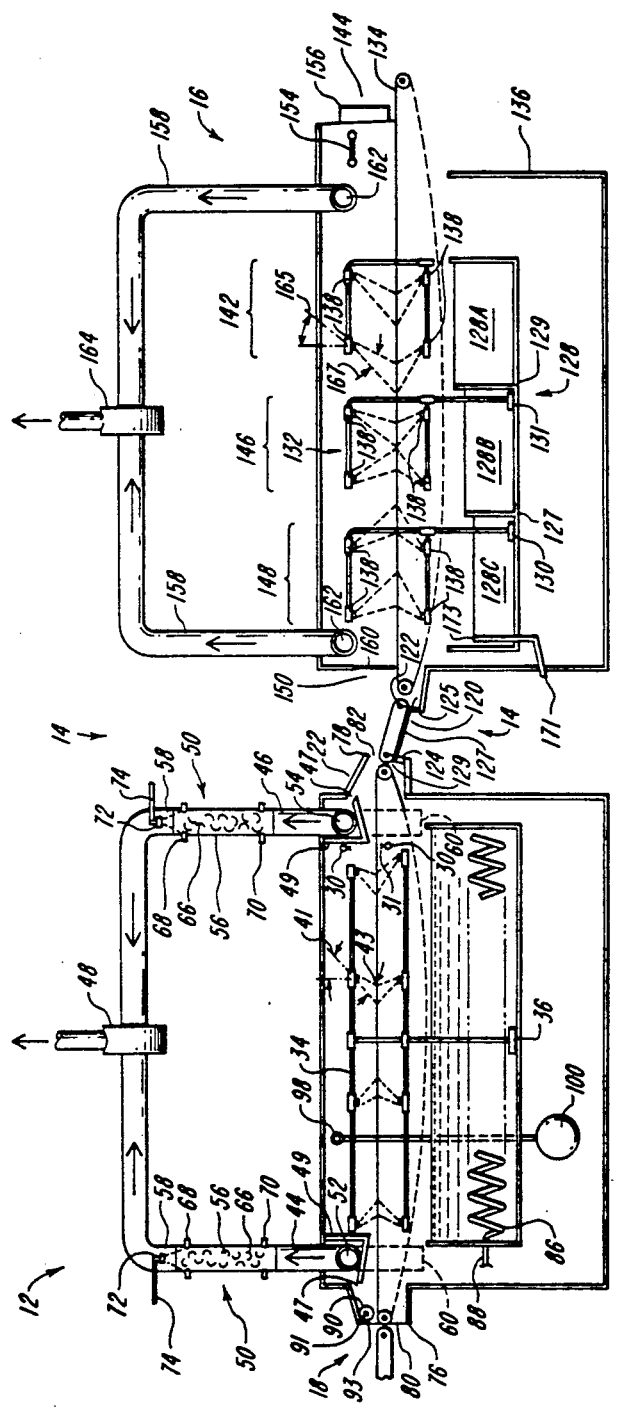
FIG. 3 is a cutaway, side plan view of the apparatus of FIG. 1.
Figure 4:
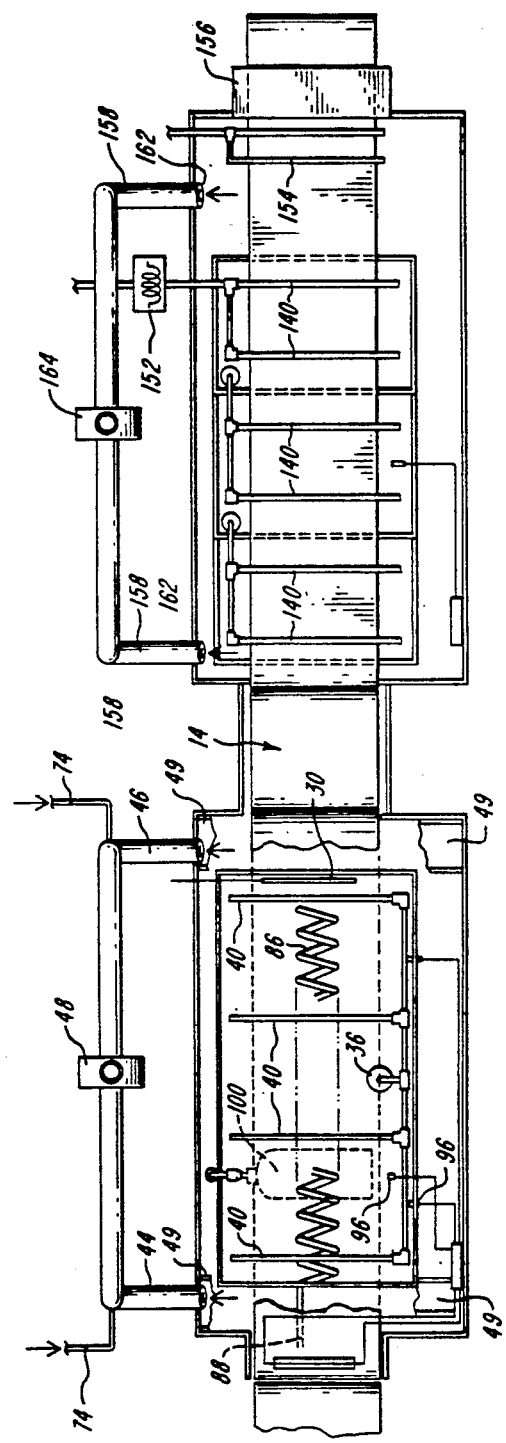
FIG. 4 is a partially cutaway, top plan view of the apparatus of FIG. 1.

With reference now to the drawings, and more particularly to FIGS. 1-3 thereof, cleaning apparatus 10 of this invention will be described. Cleaning apparatus 10 includes washing apparatus 12, unloading conveyor assembly 14 and rinsing apparatus 16. Typically, conveyor assembly 14, washing apparatus 12, and rinsing apparatus 16 are disposed in an in line relationship to permit the automatic transfer of boards from apparatus 12 to assembly 14 and to rinsing apparatus 16 without need of any human intervention.

Washing apparatus 12 will now be described with particular reference to FIGS. 1-3. Washing apparatus 12 includes a housing 26 through which a conveyor 20 passes from an inlet 18 to an outlet 22, spraying apparatus 24 disposed within housing 26, and exhaust system 28. Spraying apparatus 24 includes a bath 32 of a washing compound, sprayers 34, and at least one pump 36 for pumping the washing compound from bath 32 to sprayers 34 through conduits 38.

The washing compound in bath 32 comprises a terpene compound, preferably combined with one or more terpene emulsifying surfactants to facilitate the removal of the terpenes from printed circuit boards when rinsed with water. Terpene compounds which are suitable for this purpose include, but are not limited to, pinene, both alpha and beta isomers, gamma terpinene, delta-3-carene, limonene and dipentene. Preferred terpene compounds are limonene and dipentene. A preferred, commercially available product is sold under the trademark BIOACT EC 7 by Petroferm, Inc, of Fernandina Beach, Fla. 32034. Numerous surfactants are capable of emulsifying the terpenes of this invention, and include, but are not limited to the linear alkyl benzene sulfonates, linear or branched chain alcoholic ethoxylates and ethoxysulfates, polysorbate esters, ethoxylated alkylphenols and alkyl and dialkyl succinate compounds. An example of the latter class of compounds is sodium dioctyl sulfosuccinate. The ethoxylated alkylphenols contain various alkyl side chains and various numbers of linked ethylene oxide units. Useful compounds of this class contain from about 5 to about 20 ethylene oxide groups, with 7 or 8 being preferred. The quantity of terpene emulsifying surfactants in the compositions of the present invention may range on a weight basis from 0 to about 40%, with the terpene compounds accounting for the balance of the compositions. Useful terpene compounds, and surfactants, and methods for their use are set forth in U.S. Pat. No. 4,640,719.

Bath 32 typically resides within the lower portion of an interior cavity 27 defined by housing 26. Conveyor 20 passes directly over bath 32 so that liquid which is emitted by sprayers 34 passes through conveyor 20 and immediately returns to bath 32. Conveyor 20 is typically formed of an open mesh which has openings sufficiently small to prevent printed circuit boards from falling therethrough, but large enough to allow liquid to readily pass through. Thus, very little of the washing compound is removed from washing apparatus 12. This is important, since the washing compound of bath 32 is expensive.

Sprayers 34 may be any known, commercially available sprayer suitable for use with highly aggressive compounds, and each sprayer typically includes tube 40 and nozzles 42. Tubes 40 each have a plurality of nozzles 42 disposed on aside thereof facing conveyor 20 and preferably are oriented transversely of the direction of conveyor 20. One or more pumps 36 supply compound to nozzles 42 from bath 32 through one or more conduits 38. Each nozzle 42 preferably provides a spray which strikes the board at an angle with respect to the vertical. While the spacing of conveyor 20 from sprayer 34 is not critical, it should be sufficiently great to permit the printed circuit boards with components mounted thereon to pass between sprayers 34 and conveyor 20. However, it should not be so great that the intensity and velocity of the spray emitted by nozzles 42 is excessively diminished when striking the surface of the board. Although sprayers 34 are shown disposed both above and below conveyor 20, the sprayers below conveyor 20 are optional.

Nozzles 42 are arranged in an array such that the spray from nozzles 42 covers the entire lateral surface of conveyor 20 and a substantial portion of the length of conveyor 20 within cavity 27. It is desired that the spray from nozzles 42 on the top sprayer 34 strikes the board with sufficient intensity and at a sufficient angle that the washing compound penetrates into the small space between the components and the printed circuit board. A typical component clearance on the board is in the range of about 0.003 to about 0.008 inches, and nozzles 42 must be capable of forcing liquid into this space. In a preferred embodiment, the manifold pressure of the spray is in the range from about 20 to about 40 psi with 25 psi being preferred. Nozzles 42 preperably, although not necessarily, are disposed at an angle 41 with respect to the vertical. A preferred angle 41 is in the range of from about 10° to 25° with respect to the vertical. Typically nozzles 42 expel a fan-shaped spray which subtends an angle 43 of from about 10° to about 25°, with 15° to 20° being preferred. In a typical apparatus 12, the flow volume through sprayers 34 is about 180 gallons per minute of working compound.

Exhaust system 28 prevents the escape of vapor, droplets and odor from within housing 26, during operation of the apparatus. Exhaust system 28 includes exhaust ducts 44 and 46, exhaust fan 48 and scrubbers 50. Duct 44 has an opening 52 disposed closely adjacent inlet 18, while duct 46 has an opening 54 disposed closely adjacent outlet 22. In this manner, negative pressures are created at both inlet 18 and outlet 22 which makes it difficult if not impossible for the escape of vapors, water droplets or odors. A single fan 48 can be used for both ducts 44 and 46 or a separate fan can be used for each duct. Respective openings 52 and 54 of ducts 44 and 46 typically are disposed above top sprayers 34 and conveyor 20 closely adjacent inlet 18 and outlet 22 respectively. Preferably, a baffle 49 is disposed around each of openings 52 and 54 and extends across the width of conveyor 20. Baffle 49 includes a narrow slotted opening 47 which evenly draws air from across the width of conveyor 20.

Scrubbers 50 prevent the escape of combustible liquids, vapors, and odors to the outside atmosphere. An identical scrubber 50 is disposed in each of ducts 44 and 46. Scrubber 50 is disposed somewhere between opening 52 or 54 and fan 48. Typically, scrubber 50 includes means 56 for removing terpene vapor and droplets from the exhaust airstream, means 58 for washing means 56, drain 60 for removing the fluid from the washing means 58, a water flow detector 62 and an air flow detector 64. Scrubbing means 56 can include any material commonly used for the removal of vapors and droplets from an exhaust air stream. A preferred material is a plurality of polypropylene saddles 66 which are held in place within ducts 44 or 46 by upper retainer 68 and lower retainer 70. Retainers 68 and 70 typically are any mechanical device which permits air and water to flow therethrough, while preventing saddles 66 from falling into drain 60. A typical example is a plurality of rods criss-crossing in the center of ducts 44 or 46. Washing means 58 typically includes a nozzle 72 and a pipe 74 which is coupled to a source (not shown) of washing fluid. Typically, water is used as the washing fluid, and pipe 74 is coupled to a water supply. Nozzle 72 sprays scrubbing means 56 to wash the combustible vapors and liquids therefrom down drain 60. Opening 52 should be spaced sufficiently far from washing means 58 that water used in the washing operation does no work its way into bath 32. Typically, connecting duct 45 coupling opening 52 to duct 44 is angled slightly downwardly away from opening 52 to prevent water from running down duct 45 into bath 32 (See FIG. 5).

A hood 76 is disposed around inlet 18, while a hood 78 is disposed around outlet 22. Hood 76 has an associated narrow opening 80 through which conveyor 20 passes, and into which the printed circuit boards are inserted. Similarly, hood 78 is provided with an opening 82 through which conveyor 20 passes, and through which the printed circuit boards exit. Both openings 80 and 82 should be narrowed to facilitate the creation of negative pressure, and to enhance the rate of air flow from the exterior through inlet 18 and outlet 22 to make it more difficult for the escape of vapor, droplets or odor. Obviously, both openings 80 and 82 should be sufficiently large to allow conveyor 20 and printed circuit boards thereon to pass therethrough.

At least one air knife 30 is provided after the last sprayer 34, but prior to outlet 22 and prior to opening 54. Preferably, an air knife 30 is disposed both above and below conveyor 20. Air knife 30 typically includes a plurality of nozzles 31 through which air is forced and which are aligned transversely of the direction of movement of conveyor 20. Typically, air is forced through these nozzles 31 at a high pressure. Preferably, only one set of nozzles 31 is used, although a plurality of transversely extending sets of nozzles 31 may be used in some instances.

The purpose of air knife 30 is to remove some of the washing compound from the printed circuit boards and the devices mounted thereon. However, air knife 30 should not completely dry the boards. The boards should be left slightly damp, and some of the washing compound should be left disposed in the narrow spacing between the board surface and the components mounted thereon. By allowing some of the compound to remain in the spacing between the components and the board surface, water is wicked into the spacing during the rinsing, to allow the washing compound, along with the excess rosin solder flux to be completely washed off the board and out of the narrow spacings. It is the wetting properties of the surfactants which permits this wicking to occur. In the absence of washing compound in these narrow spacings, it is difficult to force water into the spacing to completely flush the area. However, some removal of the washing compound is required, to minimize the escape of odor and fumes into the surrounding atmosphere during the cleaning process. Typically, the use of compressed air from one set of nozzles at pressures in the range of from about 40 to almost 100 psi adequately removes the excess washing compound from, under and around the components, but it does not remove all of the compound.

Several safety systems are included in washing apparatus 12 to prevent any accidents resulting from the low flash point of the terpene compound vapors. A cooling system is provided for bath 32. The cooling system includes a temperature sensor 84, cooling coils 86 and a coolant supply line 88. Although heaters are neither used in the system nor required, heat generated by pumps 36 can raise the bath temperature by 40° F. or higher. If the temperature of bath 32 exceeds about 80° F., the fluid should be cooled. Sensor 84 senses the temperature of the bath, and when the temperature exceeds a pre-determined value, sensor 84 triggers the flow of coolant from a supply (not shown) through coolant supply line 88 and into coils 86 disposed within bath 32. Typically, the coolant used is water, and the water is circulated through coils 86 as needed to maintain the bath temperature at the desired level.

The washing apparatus is frequently disposed in an in-line configuration with a soldering apparatus, so that opening 80 of hood 76 accepts boards directly from a conveyor 77 (FIG. 1) of a soldering apparatus, such as a solder reflow apparatus. Boards exiting the soldering apparatus are immediately picked up by conveyor 20 and carried into hood 76. Depending upon the reliability of the soldering apparatus, the boards, and the components thereon, may be involved in flames. Because of the in line positioning of the washing apparatus, and because of the automated nature of the soldering procedure, the flames may go undetected. The presence of flames, or even an overly hot board within housing 26 could be dangerous, because of the low flash point of the terpene compound vapors. Therefore, to prevent any accidental ignition of the terpene compound vapors, a flame detector 90 is positioned within hood 76 at inlet 18. Flame detector 90 is positioned a sufficient distance from the interior cavity 27 of housing 26 that the presence of flame, or an excessively hot board, is detected before that board enters cavity 27. Flame detector 90 includes a core 91 within a housing 93 which formed of a metal or some other material which melts at a predetermined, low temperature. Flame detector 90 can be any conventional commercially available device used for such purposes, and typically is an eutectic salt detector. An acceptable, commercially available detector can be obtained from Walter Kidde Co., and includes a KIC-100 Control Unit. When the predetermined melting temperature of this material is exceeded by heat produced by the flame or by some other heat source on conveyor 20, core 91 melts, interrupting the flow of a current through flame detector 90. This current interruption immediately disables the washing apparatus 12, stopping conveyor 20 and pump 36 to terminate the spraying activity, and movement of printed circuit boards through housing 26. In this manner, any overheated board or one which is on fire will not enter cavity 27, and there is no danger of any vapor ignition. Exhaust fan 48 continues to run, drawing vapors from cavity 27 to prevent any vapor build-up during the period of shutdown.

Figure 5:
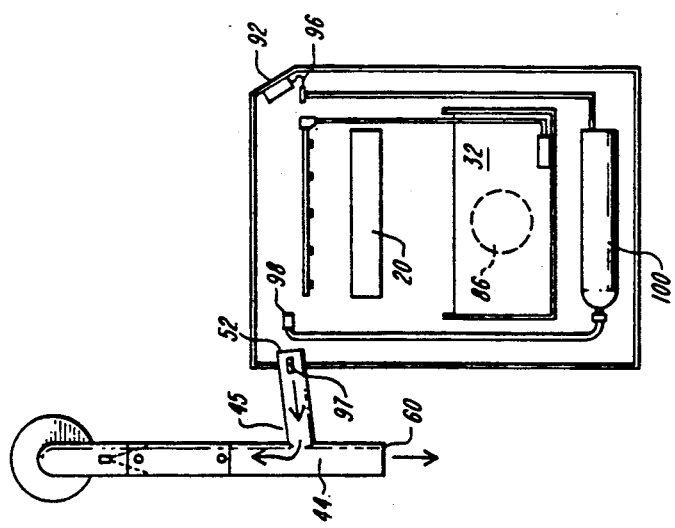
FIG. 5 is a cutaway, end plan view of the apparatus of FIG. 1 taken from the left end as shown in FIG. 1.

An alternative embodiment of the flame detector is shown in FIG. 5. A commercially available photo-ionization detector 97 can be mounted at a strategic location within cavity 27 at a point where flaimes at inlet 18 can be detected. Detector 97 illustratively is shown mounted at opening 52 in FIG. 5 and pointed toward inlet 18. Detector 97 also disables washing apparatus 12 to shut down conveyor 20 and pump 36. A commercially available example is a UV TRON R2868, sold by Hamamatsu.

Sensor 84 in bath 32 also provides an over-temperature control. Sensor 84 is coupled to control panel 92. If the temperature of bath 32 exceeds a preset value, as measured by sensor 84, pump 36 and conveyor 20 are disabled, stopping the washing and conveying operation. In this manner, operation is terminated well before the vapor flash temperature is reached. Typically, the bath temperature which triggers the shutdown is about 90° F. As a further safety feature, a second redundant temperature sensor 94 is provided in bath 32 at a location different from that of sensor 84. If the temperature measured by sensor 94 exceeds a second predetermined value, which is approximately 5° F. higher than the first predetermined value associated with sensor 84, pump 36 and conveyor 20 are again disabled. In this manner, should sensor 84 fail, sensor 94 serves as a back-up. In both instances, resumption of activity cannot occur until the bath temperature drops sufficiently, or until the temperature control is manually overridden a control panel 92.

One or two temperature sensors 96 are positioned above conveyor 20 and top sprayers 34. Sensors 96 monitor the temperature of the vapor overlying bath 32, and of the liquid being emitted by sprayers 34. If the temperature detected by either of sensors 96 exceeds a predetermined value, such as 140° F., a signal is sent to control panel 92, which opens a valve 98, releasing carbon dioxide from a cylinder 100 beneath bath 32 into the space in cavity 27 overlying bath 32. Thus, if the temperature of the vapors overlying bath 32 begins to approach the flash point thereof, carbon dioxide is released to suppress any potential fire, and to reduce the vapor temperature.

Safety shut-offs are also provided in conjunction with scrubber means 56 to prevent the release of corrosive vapors or odors into the atmosphere. A water flow detector 62 is disposed in each of ducts 44 and 46 just below washing means 58. If insufficient water, below a predetermined threshold, is flowing from washing means 58 to cleanse scrubber means 56, a signal is provided to control panel 92 which disables conveyor 20 and pump 36 to stop the washing process. A similar function is provided by an air flow detector 64, one of which is positioned in each of ducts 44 and 46. If insufficient air flow, below a predetermined threshold, is detected from cavity 27 by detector 64 through either of ducts 44 or 46, a signal is sent to control panel 92 which again disables conveyor 20 and pump 36 to stop the washing process. In this manner, proper ventilation is maintained during operation of washing apparatus 12, and the release of odors or vapor through inlet 18 or outlet 22 due to the failure of fan 48 to adequately vent cavity 27 is prevented. Also, proper washing of scrubber means 56 is maintained. Typically, the threshold for water flow detector 62 is 0.6–1.0 gallons per minute, while the threshold for air flow detector 64 is 200–300 cubic feet of air per commercially available, acceptable water flow detector is an AFS-4 series switch sold by IMO Industries, Gems Sensor Division. A commercially available, acceptable air flow detector is a Model 530 airflow switch sold by Dwyer.

In addition to the foregoing, if for any reason the operator wishes to stop the rinsing or washing process, manual stop buttons 100 are provided on control panel 92. Furthermore, a button is provided at a remote location to permit the operator to manually release carbon dioxide, if flames are sited.

Unloading conveyor assembly 14 will now be described with particular reference to FIGS. 1–3. Conveyor assembly 14 automatically transfers washed printed circuit boards from conveyor 20 to rinsing apparatus 16. Conveyor assembly 14 includes a conveyor 120 mounted within a frame 122. Conveyor 120 rests on lip 124 of hood 78 of apparatus 12 at one end and on support 125 extending from apparatus 16. A pan 127 resides underneath conveyor 120 to catch any water thereon and conduct it to apparatus 16. A lip 129 on the end of pan 127 facing apparatus 12 prevents any water on conveyor 120 from being splashed onto conveyor 20. The ends of conveyor 120 are spaced from adjacent ends of conveyors 20 and 134, but are closely adjacent thereto. Preferably, conveyor 120 extends into hood 78 and into inlet 150.

Conveyor 120 may be an open mesh conveyor, similar to conveyor 20 to prevent the transport of washing compound from apparatus 12 or the transport of water from apparatus 16 to apparatus 12. Conveyor 120 is disposed at an angle with respect to the horizontal, such that the portion thereof closest to outlet 22 of apparatus 12 and which receives boards from conveyor 20 is higher vertically than the portion thereof closest to rinsing apparatus 16 which delivers boards to apparatus 16. Should water be deposited on conveyor 120 by rinsing apparatus 16, this water will tend to run downhill under the influence of gravity towards rinsing apparatus 16, and not towards washing apparatus 12. In this manner, any flow of water or water vapor from rinsing apparatus 16 to washing apparatus 12 along assembly 14 is eliminated, and all water on assembly 14 is returned to apparatus 16. The angle that conveyor 120 forms with respect to the horizontal should exceed 5°, and an angle of 5°-10° is preferred.

Assembly 14 is either exposed to permit air to circulate around it, as shown in FIGS. 1-3, or it is housed separately and distinctly from both washing apparatus 12 and rinsing apparatus 16.

If a housing is provided surrounding assembly 14, such a housing should have openings at either end thereof to permit conveyor 120 and the boards to pass therethrough. However, a housing surrounding assembly 14 is not necessary, as the boards are almost dry when reaching conveyor 120, and emission of the odoriferous vapor into the atmosphere is not a serious problem. In addition, any such housing does not have much, if any, impact on the transfer of water vapor from rinsing apparatus 16 to washing apparatus 12.

Conveyor assembly 14 separates the rinsing apparatus 16 sufficiently from the washing apparatus 12, so that no water from rinsing apparatus 16 finds its way into bath 32. As previously indicated, small amounts of water can cause the terpene in bath 32 to gel, interfering with its free flow through sprayers 34. If sufficient gel forms in bath 32, it must be discarded, and a new bath utilized. Typically, a single bath 32 can be used for several months of operation before it must be replaced, because of the ability of the terpene compounds to dissolve large quantities of rosin flux. Because of the expensive nature of the bath, it is highly undesirable to have to change the bath at more frequent intervals than is necessary. Assembly 14 should be sufficiently long to space washing apparatus 12 from rinsing apparatus 16 a amount necessary to minimize the transfer of any water vapor or water from rinsing apparatus 16 to bath 32. It has been found that a typical distance which is sufficient to perform this function is about 24 inches.

Rinsing apparatus 16 will now be described with particular reference to FIGS. 1-3. Rinsing apparatus 16 rinses the washing compound, such as a terpene compound, from the board and completes the removal of rosin fluxes. Disposed within housing 136 of apparatus 16 is a water bath 128, a pump 130, sprayers 132, conveyor 134, air knives 154 and dryer 156. Conveyor 134 is an open mesh conveyor which permits water from sprayers 132 to return to bath 128 after rinsing of the boards. Conveyor 134 transports the boards through apparatus 16 from an inlet 150 to an outlet 144. Sprayers 132 are similar to sprayers 34, and are disposed both above and below conveyor 134. Sprayers 132 comprise an array of nozzles 138 which cover the entire width and a substantial portion of the length of conveyor 134 with a water spray. In one embodiment, sprayers 132 comprise a plurality of generally parallel tubes 140 which extend transversely of the direction of movement of conveyor 134, each of which contain a plurality of nozzles 138. Typically, nozzles 138 spray the boards at an angle with respect to the vertical and with a fan shaped spray, to flush fluxes and washing compounds from the spaces between the components and the board surface. The number of nozzles 138 and tubes 140 is selected such that the entire width and a desired portion of the length of conveyor 134 is covered by spray. The exact number of each depends upon the angle of spray. In one embodiment, 14 tubes are used in conjunction with 3 nozzles per tube. Typically, nozzles 138 are disposed at an angle 165 of zero to 20° with respect to the vertical, with 15°-20° being preferred. The spray angle 167 is preferably about 120°.

Prefereably, deionized or tap water is used in water bath 128. The water bath can comprise two or more stages, or it can comprise a single stage, as desired. In addition, either recycled or fresh water can be used. A preferred structure is shown in FIGS. 2 and 3. This embodiment comprises a three step rinsing process in which sprayers 132 are divided into three groups, initial rinse sprayers 148, secondary rinse sprayers 146 and final rinse sprayers 142. Sprayers 148 are disposed adjacent inlet 150, while sprayers 142 are disposed between inlet 150 and air knives 154. Bath 128 is segmented into three sections, 128A, 128B and 128C by walls 127 and 129. Section 128A recovers water from sprayers 142, while section 128B recovers water from sprayers 146. Water from sprayers 148 is collected by section 128C. Pump 131 pumps collected water from sprayer 146 in section 128B to sprayers 146, while pump 130 pumps water collected from sprayers 148 in section 128C to sprayers 148. Fresh water is supplied to sprayers 142 and supplies section 128A. Water in section 128A overflows wall 129 to supply section 128B, and water in section 128B overflows wall 127 to supply section 128C. Pipe 171 drains water from section 128C when the water level exceeds that of top 173 of pipe 171. In this manner, the dirtiest water is used when the boards enter rinsing apparatus 16 at inlet 150, while the cleanest water is used just prior to air knives 154. The flow of water into and out of rinsing apparatus 16 obviously should be equal, and typically is in the range of about 4 to 5 gallons per minute. It should be understood that additional groups of sprayers can be provided, so long as the cleanest water is introduced in the sprayers most closely adjacent outlet 144. Instead of three rinse steps, 4, 5, 6 or more rinse steps may be used with the water recovered from each step being recirculated to the sprayers in the immediately preceding step.

Although not necessary, typically a heater or heaters 152 is provided to heat the water supplied to sprayers. A preferred temperature is about 120° F. A heater 155 may also be incorporated into baths 128B and 128C to maintain an elevated temperature in the rinse water used for sprayers 146 and 148. Heating the rinse water assists in the removal of the cleaning compound and enhances drying.

In a preferred embodiment, an air knife 154, or a plurality of air knives 154 is provided between sprayers 142 and outlet 144. Preferably, air knives 154 are disposed between openings 162 and outlet 144. Air knives 154 assist in mechanically removing free standing water. Air knives 154 may be identical to air knife 30 and comprise a tube having a plurality of nozzles to which air is supplied under pressure. Either heated or non heated air may be supplied to air knife 154, although typically, air heated by heater 157 is utilized. Heater 157 can be either an air heater or it can be part of the blower 177. Heater 157 elevates the board temperature in preparation for later drying within housing 153. A dryer 156 is provided at outlet 144 to dry the boards and components. Although dryer 156 is not necessary, it assists in the final removal of water. Typically, dryer 156 is an infrared heater and is disposed within a portion of housing 136. The board enters dryer 156 after leaving air knife 154 and the remaining water is evaporated and the board is dried. The temperature of dryer 156 should be adjusted to allow for various board configurations.

A baffle 160 is provided at inlet 150 to minimize the escape of water and water vapor from the interior of rinsing apparatus 16. Baffle 160 is typically a flexible curtain suspended from its top edge which has been segmented into a plurality of vertically extending strips and which can be easily pushed aside by the boards a they enter through inlet 150. This curtain maybe composed of any flexible material, but typically Viton is used.

At least two exhaust ducts 158 are provided having openings 162 within housing 136, one opening 162 adjacent inlet 150 and the other opening 162 adjacent outlet 144. Ducts 158 are coupled to fan 164 which exhausts air from the interior of housing 136. In this manner, a negative air pressure is created at both inlet 150 and outlet 144 to minimize the escape of water and water vapor from the interior of housing 136.

Figure 6:
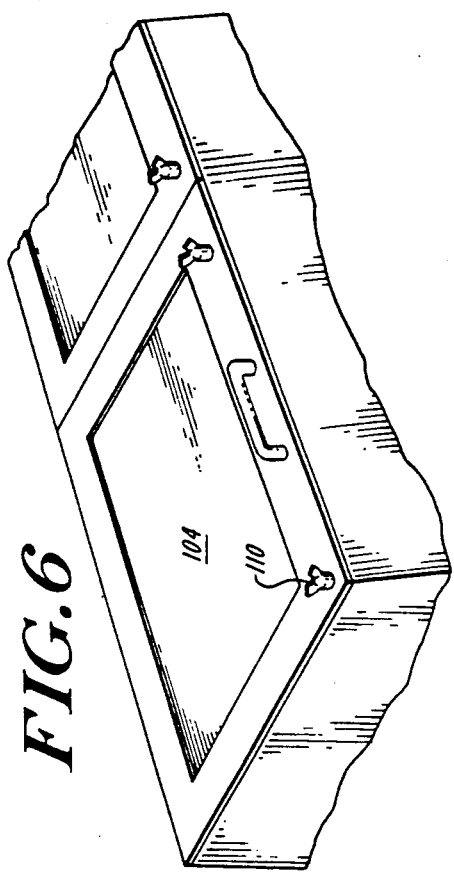
FIG. 6 is a partial top, perspective view of the windows of the apparatus of FIG. 1.
Figure 7:
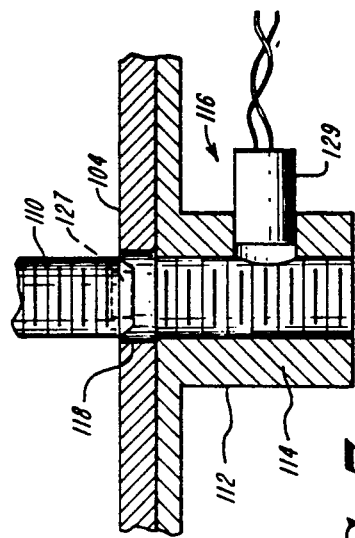
FIG. 7 is a partial cross-sectional side plan view of the window locks of FIG. 6.

In a preferred embodiment, as shown in FIGS. 6 and 7, windows 104 are provided in the top surface of washing apparatus 12, as shown in FIGS. 2 and 3. Windows 104 typically are affixed to housing 26 along one edge by hinge 106 which permits them to be pivoted from an open to a closed position. Access to the interior of housing 26 can be gained by opening one of the windows. Locks 108 secure windows 104 against housing 26 in a closed position. Locks 108 are provided in conjunction with each window 104 along an edge opposite of the location of hinge 106. A preferred embodiment of locks 108 is shown in FIGS. 6 and 7. Typically, each lock 108 includes a manually operable bolt 110, threaded onto window 104, and a cooperatively threaded nut 112 disposed on the outer, upper surface of housing 26 along frame 114 of window 104. Windows 104 are locked by threading bolt 110 into nut 112. A safety feature is provided wherein washing apparatus 12 can not be operated unless windows 104 are locked. A switch 116 is disposed within nut 112, and senses whether tip 118 of bolt 110 has penetrated to the location of switch 116. Once all switches 116 in all locks 108 have been tripped by the passage of tips 118 of bolts 110, power is supplied to apparatus 10 through control panel 92. Typically, switch 116 is positioned at the bottom of nut 112, so that all windows 104 are at least partially secured to respective window frames 114 during operation of apparatus 10. Switch 116 typically is a reed-type switch, which includes a magnet 127 in tip 118 and a sensor 129 in nut 112. Similar locks may also be provided in conjunction with windows in the top of rinsing apparatus 16.

The operation of apparatus 10 of this invention will now be described with particular reference to FIGS. 1-3. Typically, apparatus 10 is disposed in an in-line relationship with a soldering apparatus, such as a VITRONICS infrared solder reflow apparatus for mounting surface mounted devices to printed circuit boards. The conveyor 77 for this, or some other type of soldering apparatus is partially shown in FIG. 1. After the soldering process has been completed, printed circuit boards 170 are transferred across a gap between conveyor 166 onto conveyor 20 at opening 80 of hood 76. These printed circuit boards 170 are then transferred by conveyor 20 into and through housing 26. These boards first pass through hood 76, and beneath flame detector 90. If flame detector 90 detects a flame or excess heat on a board 170 passing therebeneath, the material within flame detector 90 is melted, breaking the circuit passing therethrough, and disabling the apparatus. Otherwise, the printed circuit board passes into the interior of housing 26.

During this time, fan 48 is creating a negative pressure at opening 80, drawing air into the interior of housing 26 and exhausting it, after the air passes through scrubbers 50. Liquid and solid particles are removed from the exhaust air stream by scrubbers 50, and are passed to drain 60 by washers 58. If no water is flowing within washers 58, water flow detector 62 disables the machine. Similarly, if no air is flowing through scrubbers 50, air flow detector 64 disables the machine, stopping conveyor 20 and pump 36.

Printed circuit boards 170 pass beneath sprayers 34 where they are washed for a desired period of time by a terpene compound emitted by nozzles 42. Each tube 40 washes the board in sequence, and the washing time is determined by the conveyor speed and the number of tubes 40. The compound emitted by nozzles 42 strikes the board with sufficient force and at a sufficient angle with respect to the vertical to remove any rosin flux, and to be forced into the narrow spaces between the components mounted on the board, and the board surface. The material in the bath typically is a terpene compound, mixed with a surfactant as previously described. A preferred terpene compound is sold under the trademark BIOACT EC-7.

As board 170 approaches outlet 22, it passes beneath air knife 30 which directs a high velocity air stream onto the board to remove excess amounts of the terpene compound, but which does not remove all of it, leaving the board slightly damp. The airstream preferably is disposed at an angle with respect to the vertical. The board then passes through hood 78 and over a gap between conveyor 20 and conveyor 120 onto unloading conveyor assembly 14. Fan 48 again creates a negative air pressure at opening 82 drawing air into the interior of housing 26, to prevent the escape of any vapors or droplets through opening 82 as the board departs. The board then travels downwardly toward rinsing apparatus 16 on conveyor assembly 14.

As the board approaches rinsing apparatus 16 on conveyor 120, any water which escapes from the interior of rinsing apparatus 16 will condense and run down conveyor assembly 14 back into rinsing apparatus 16. Also, since most of the terpene compound solution has been removed from the board prior to passing through outlet 22, very little terpene compound escapes into the surrounding air.

The board passes onto conveyor 134 across the narrow gap between conveyor 120 and conveyor 134. Baffle 160 is pushed aside by the board as it enters apparatus 16. While baffle 160 is sufficiently flexible to allow a board to pass therebeneath, gravity returns it to its original position, effectively closing inlet 150 to prevent the escape of water and vapor. Fan 164 draws air in through inlet 150 and into duct 158, further inhibiting the escape of water or water vapor through inlet 150. The board then passes beneath sprayers 148, 146 and 142 in sequence. Each of sprayers 148, 146 and 142 extends across the entire width of conveyor 134, and each fully involves the board with its water spray. The spray from the nozzles 138 associated with each of these sprayers is sufficiently strong and disposed at a sufficient angle with respect to the vertical to wash down the board and remove solder fluxes, and to force the water beneath the components on the board. The wetting or wicking action of the surfactant assists in drawing water beneath the components to cleanse the small spaces thereunder. The water supplied to sprayers 148 is drawn from section 128C, conducted to sprayers 148, and is recovered by section 128C, after which the water is drained by pipe 171. The board then passes beneath sprayers 146. Water is drawn from section 128B, passed through sprayers 146 to provide a second rinse, and is recovered by section 128B. Afterward, water flows over wall 127 into section 128C. Finally, the board passes beneath sprayers 142 which are the final stage rinse. Clean water is used such as tap water. Water emitted by sprayers 142 is collected by bath 128A and afterward, water flows over wall 129 into section 128B. Preferably, this water is heated by heater 152 prior to being conducted to sprayers 142. The board then passes beneath air knife 154 which removes most of the free standing water and remaining dissolved rosin fluxes from the board. Finally, if desired, the board passes beneath dryer 156 after it exits outlet 144 and passes into housing 153. The board is now dried and ready for use.

Because of the highly aggressive nature of most terpene compounds, the components of apparatus 10 must be formed of a material which would not be affected by these compounds. There are a variety of materials which are compatible with terpene compounds, and which may be used to form sprayers 34, housing 26, conveyor 20 and other components of washing apparatus 12 which are directly exposed to the terpene compounds and their vapors. Various types of Teflon ® as well as polyvinyl difluoride are plastics which can be used to form these components. Stainless steel may also be used, and is the preferred component, because it not only withstands the terpene compounds, but also is unaffected by the water rinse. The tubing used in the apparatus can be stainless steel, bronze, copper or galvanized steel.

The foregoing apparatus is capable of removing rosin solder fluxes from printed circuit boards and other like assemblies using terpene compounds. Such apparatus is more effective than prior art apparatus which use chlorinated hydrocarbon and chlorofluorinated compounds, and performs better than most aqueous cleaning apparatus. Studies have shown that terpene compound cleaning leaves less residue is left on the surfaces of the boards and components. Furthermore, in contrast to prior art apparatus, this apparatus does not create any hazard to the environment, as the by products of the cleaning process are fully biodegradable.

In view of the above description, it is likely that modifications and improvements will occur to those skilled in the art which are within the scope of this invention. The above description is intended to be exemplary only, the scope of the invention being defined by the following claims and their equivalents.

What is claimed is:

1. Apparatus for cleaning devices using terpene compounds, said apparatus comprising:
   a first housing having an inlet and an outlet;
   first means for conveying devices through said first housing from said inlet to said outlet;
   washing means disposed in said first housing for spraying the devices with a liquid terpene compound;
   a second housing spaced from said first housing and having an entrance and an exit;
   second means for conveying devices through said second housing from said entrance to said exit;
   rinsing means disposed in said second housing for spraying the devices with water;
   third means disposed between said first housing and said second housing for conveying devices from said outlet of said first housing at a first end of said third conveying means to said entrance of said second housing at a second end of said third conveying means, said third conveying means being unconnected to and spaced from said first and said second conveying means and being disposed at an angle with respect to the horizontal whereby said second end of said third conveying means is disposed below said first end thereof; and
   means for preventing ignition of vapors disposed within said first housing, said preventing means comprising:
      a temperature sensor in a terpene compound containing bath disposed in said first housing; and
      means for disabling said washing means for spraying and said first conveying means if said temperature sensor detects a bath temperature exceeding a predetermined value.

2. Apparatus for cleaning devices using terpene compounds, said apparatus comprising:
   a first housing having an inlet and an outlet;
   first means for conveying devices through said first housing from said inlet to said outlet;
   washing means disposed in said first housing for spraying the devices with a liquid terpene compound;
   a second housing spaced from said first housing and having an entrance and an exit;
   second means for conveying devices through said second housing from said entrance to said exit;
   rinsing means disposed in said second housing for spraying the devices with water;
   third means disposed between said first housing and said second housing for conveying devices from said outlet of said first housing at a first end of said third conveying means to said entrance of said second housing at a second end of said third conveying means, said third conveying means being unconnected to and spaced from said first and second conveying means and being disposed at an angle with respect to the horizontal whereby said second end of said third conveying means is disposed below said first end thereof; and
   means for exhausting gases within said first housing and for drawing ambient air into said first housing through said inlet and said outlet of said first housing, said exhausting and drawing means comprising scrubber means for removing pollutants from air exhausted from said first housing, said scrubber means comprising:
      an exhaust pipe for conducting gases and vapors from said first housing to an exhaust fan;
      air permeable pollution removal means disposed intermediate said exhaust fan and said first housing, said pollution removal means removing liquid and solid components of the air flow therefrom; and
      second means for washing said pollution removal means to remove and wash away pollutants therefrom.

3. Apparatus as recited in claim 2, further comprising:
   sensor means for determining whether liquid is flowing from said pollution removal means; and
   means responsive to said sensor means for disabling said first conveying means and said washing means for spraying when no fluid is being emitted by said second washing means.

4. Apparatus for cleaning devices using terpene compounds, said apparatus comprising:
a first housing having an inlet and an outlet;
first means for conveying devices through said first housing from said inlet to said outlet;
washing means disposed in said first housing for spraying the devices with a liquid terpene compound;
a second housing spaced from said first housing and having an entrance and an exit;
second means for conveying devices through said second housing from said entrance to said exit;
rinsing means disposed in said second housing for spraying the devices with water;
third means disposed between said first housing and said second housing for conveying devices from said outlet of said first housing at a first end of said third conveying means to said entrance of said second housing at a second end of said third conveying means, said third conveying means being unconnected to and spaced from said first and said second conveying means and being disposed at an angle with respect to the horizontal whereby said second end of said third conveying means is disposed below said first end thereof;
means for exhausting gases within said first housing and for drawing ambient air into said first housing through said inlet and said outlet of said first housing;
air flow sensor means disposed in said exhausting and drawing means; and
means responsive to said air flow sensor means for disabling said first conveying means and said washing means for spraying when no air flow is detected by said air flow sensor means.

5. Apparatus for cleaning devices using terpene compounds, said apparatus comprising:
a first housing having an inlet and an outlet;
first means for conveying devices through said first housing from said inlet to said outlet;
washing means disposed in said first housing for spraying the devices with a liquid terpene compound;
a second housing spaced from said first housing and having an entrance and an exit;
second means for conveying devices through said second housing from said entrance to said exit;
rinsing means disposed in said second housing for spraying the devices with water;
said second housing comprising a first washing stage disposed adjacent said entrance of said second housing and a second washing stage disposed adjacent said exit of said second housing;
means for supplying fresh water to said second washing stage;
means for recovering water used to wash boards in said second washing stage and circulating said water to said first washing stage;
means for recovering water from said first washing stage and draining said water from said second housing; and
third means disposed between said first housing and said second housing for conveying devices from said outlet of said first housing at a first end of said third conveying means to said entrance of said second housing at a second end of said third conveying means, said third conveying means being unconnected to and spaced from said first and said second conveying means and being disposed at an angle with respect to the horizontal whereby said second end of said third conveying means is disposed below said first end thereof.

6. Apparatus for cleaning devices using terpene compounds, said apparatus comprising:
a first housing having an inlet and an outlet;
first means for conveying devices through said first housing from said inlet to said outlet;
washing means disposed in said first housing for spraying the devices with a liquid terpene compound;
a second housing spaced from said first housing and having an entrance and an exit;
second means for conveying devices through said second housing from said entrance to said exit;
rinsing means disposed in said second housing for spraying the devices with water;
third means disposed between said first housing and said second housing for conveying devices from said outlet of said first housing at a first end of said third conveying means to said entrance of said second housing at a second end of said third conveying means, said third conveying means being unconnected to and spaced from said first and said second conveying means and being disposed at an angle with respect to the horizontal whereby said second end of said third conveying means is disposed below said first end thereof;
windows disposed in a wall of said first housing;
hinge means for permitting said windows to be opened;
means for locking said windows in a closed position;
means for sensing whether said windows are in a locked condition; and
means responsive to said sensing means for disabling said first conveying means and said washing means for spraying if said windows are not in a locked condition.

7. Apparatus for washing printed circuit boards with a terpene compound for removal of solder rosin fluxes, said apparatus comprising: a first housing for containing a bath comprising a terpene compound, said housing having an inlet and an outlet;
first means for conveying printed circuit boards from said inlet to said outlet through said first housing, said conveying means being adapted to receive printed circuit boards at said inlet from a soldering apparatus;
means for spraying terpene compounds from said bath onto boards disposed on said first conveying means within said first housing, said spraying means spraying said boards with sufficient force and at a sufficient angle to permit the terpene compounds to flow in a narrow space between components and a surface of the board disposed therebeneath;
temperature sensing means for preventing ignition of vapors within said first housing;
a second housing having an entrance and an exit;
means disposed adjacent said inlet and said outlet of said first housing for exhausting air from an interior of said first housing and for preventing the escape of vapors from said first housing;
second means for conveying boards from said entrance to said exit of said second housing;
means disposed in said second housing for rinsing terpene compounds from boards;

means associated with said exhausting means for removing pollutants from gases from the interior of said first housing;

means for preventing the escape of vapors from said second housing; and third means for conveying boards from said outlet of said first housing to said entrance of said second housing, said conveying means being disposed at an angle with respect to the horizontal wherein boards being conveyed from said outlet of said first housing to said entrance of said second housing move in a downwardly direction, said third conveying means being outside of said first housing and outside of said second housing and being unconnected to said first conveying means and said second conveying means.

8. Apparatus for cleaning devices using a fluid substance, aid apparatus comprising:
a housing having an inlet and an outlet;
means for conveying devices through said housing from said inlet to said outlet;
washing means disposed in said housing for spraying the devices with a fluid substance;
means for preventing ignition of vapors disposed within said housing, said preventing means comprising:
a temperature sensor in a fluid substance containing bath disposed in said housing; and
means for disabling said washing means for spraying and said conveying means if said temperature sensor detects a bath temperature exceeding a predetermined value.

9. Apparatus for cleaning devices using a fluid substance, said apparatus comprising:
a first housing having an inlet and an outlet;
first means for conveying devices through said first housing from said inlet to said outlet;
washing means disposed in said first housing for spraying the devices with a fluid substance;
a second housing spaced from said first housing and having an entrance and an exit;
second means for conveying devices through said second housing from said entrance to said exit;
rinsing means disposed in said second housing for spraying the devices with water;
third means disposed between said first housing and said second housing for conveying devices from said outlet of said first housing to said entrance of said second housing;
mean for exhausting gases within said first housing and for drawing ambient air into said first housing; and
scrubber means disposed in said exhausting and drawing means for removing pollutants from air exhausted from said housing, said scrubber means comprising:
an exhaust pipe for conducting gasses and vapors from said first housing;
air permeable pollution removal means for removing liquid and solid components of the air flow therefrom; and
second means for washing said pollution removal means to remove and wash away pollutants therefrom.

10. Apparatus as recited in claim 9 further comprising:
sensor means for determining whether liquid is flowing from said pollution removal means; and
means responsive to said sensor means for disabling said conveying means and said washing means for spraying when no fluid is being emitted by said second washing means.

11. Apparatus for cleaning devices using a fluid substance, said apparatus comprising:
a housing having an inlet and an outlet;
means for conveying devices through said housing from said inlet to said outlet;
washing means disposed in said housing for spraying the devices with a fluid substance;
means for exhausting gases within said housing and for drawing ambient air into said housing;
air flow sensor means disposed in said exhausting and drawing means; and
means responsive to said air flow sensor means for disabling said conveying means and said washing means for spraying when no air flow is detected by said air flow sensor means.

12. Apparatus for cleaning devices using a fluid substance, said apparatus comprising:
a first housing having an inlet and an outlet;
first means for conveying devices through said first housing from said inlet to said outlet;
washing means disposed in said first housing for spraying the devices with a fluid substance;
a second housing spaced from said first housing and having an entrance and an exit;
second means for conveying devices through said second housing from said entrance to said exit;
rinsing means disposed in said second housing for spraying the devices with water;
third means disposed between said first housing and said second housing for conveying devices from said outlet of said first housing to said entrance of said second housing;
windows disposed in a wall of said first housing;
hinge means for permitting said windows to be opened;
means for locking said windows in a closed position;
means for sensing whether said windows are in a locked condition; and
mans responsive to said sensing means for disabling said first conveying means and said washing means for spraying if said windows are not in a locked condition.

13. Apparatus for washing devices with a fluid substance, said apparatus comprising:
a first housing for containing a bath comprising a fluid substance, said first housing having an inlet and an outlet;
first means for conveying devices from said inlet to said outlet through said first housing, said first conveying means being adapted to receive devices at said inlet;
means for spraying the fluid substance from said bath onto devices disposed on said first conveying means within said first housing;
temperature sensing means for preventing ignition of vapors within said first housing;
means disposed adjacent said inlet and said outlet of said first housing for exhausting air from an interior of said first housing and for preventing the escape of vapors from said first housing;
a second housing having an entrance and an exit;
second means for conveying devices from said entrance to said exit of said second housing;

means disposed in said second housing for rinsing a fluid substance from devices;

means associated with said exhausting means for removing pollutants from gasses from the interior of said first housing;

means for preventing the escape of vapors from said second housing; and third means for conveying devices from said outlet of said first housing to said entrance of said second housing.

14. Apparatus as recited in claim 13 further comprising air jets disposed within said first housing adjacent said outlet for removing some but not all of the fluid substance from devices.

15. Apparatus for cleaning devices using a fluid substance, said apparatus comprising:

a housing having an inlet and outlet;

means for conveying devices through said housing from said inlet and said outlet;

washing means disposed within said housing at a location spaced from said inlet of said housing for spraying the devices with a fluid substance;

flame detecting means disposed above said conveying means at said inlet of said housing spaced from said washing means, said flame detecting means detecting the presence of a flame on a device before being sprayed by said washing means; and means for disabling said washing means for spraying and said conveying means if said flame detecting means detects a flame on a device.

16. Apparatus for cleaning devices using a fluid substance, said apparatus comprising:

a housing having an inlet and an outlet;

means for conveying devices through said housing from said inlet to said outlet;

washing means disposed in said housing for spraying the devices with a fluid substance;

means for exhausting gasses within said housing and for drawing ambient air into said housing;

scrubber means disposed in said exhausting and drawing means for removing pollutants from air exhausted from said housing, said scrubber means comprising;

an exhaust pipe for conducting gasses and vapors from said housing to an exhaust fan;

air permeable pollution removal means disposed intermediate said exhaust fan and said housing, said pollution removal means removing liquid and solid components of the air flow therefrom; and second means for washing said pollution removal means to remove and wash away pollutants therefrom;

sensor means for determining whether fluid is flowing from said pollution removal means; and mean responsive to said sensor means for disabling said conveying means and said washing means for spraying when no fluid being emitted by said second washing means.

* * * * *